(12) United States Patent
Youn

(10) Patent No.: US 10,984,975 B2
(45) Date of Patent: Apr. 20, 2021

(54) INSTALLATION STRUCTURE OF THERMAL FUSE

(71) Applicant: MANDO CORPORATION, Gyeonggi-do (KR)

(72) Inventor: Donghyun Youn, Gyeonggi-do (KR)

(73) Assignee: MANDO CORPORATION, Gyeonggi-Do (KR)

( * ) Notice: Subject to any disclaimer, the term of this patent is extended or adjusted under 35 U.S.C. 154(b) by 181 days.

(21) Appl. No.: 16/228,700

(22) Filed: Dec. 20, 2018

(65) Prior Publication Data
US 2019/0206651 A1 Jul. 4, 2019

(30) Foreign Application Priority Data
Dec. 28, 2017 (KR) .................. 10-2017-0181933

(51) Int. Cl.
| | |
|---|---|
| *H01H 85/02* | (2006.01) |
| *H01H 85/143* | (2006.01) |
| *H01H 85/08* | (2006.01) |
| *H01H 85/041* | (2006.01) |
| *G01R 31/04* | (2006.01) |
| *G01R 27/02* | (2006.01) |
| *G01R 31/70* | (2020.01) |

(52) U.S. Cl.
CPC ......... *H01H 85/0241* (2013.01); *G01R 27/02* (2013.01); *G01R 31/70* (2020.01); *H01H 85/041* (2013.01); *H01H 85/08* (2013.01); *H01H 85/143* (2013.01); *H01H 2085/0266* (2013.01); *H01H 2085/0275* (2013.01)

(58) Field of Classification Search
CPC .. H01H 85/0241; H01H 85/143; H01H 85/08; H01H 85/041; H01H 2085/0266; G01R 31/70; G01R 27/02
See application file for complete search history.

(56) References Cited

U.S. PATENT DOCUMENTS

| | | | | |
|---|---|---|---|---|
| 5,276,422 | A * | 1/1994 | Ikeda ..................... | H01H 77/04 337/28 |
| 8,665,057 | B2 * | 3/2014 | Schlenker ............ | H05K 1/0201 337/407 |
| 2009/0303026 | A1 * | 12/2009 | Broggi ................ | G06K 9/00805 340/435 |
| 2011/0165796 | A1 * | 7/2011 | Riemeijer .............. | H01R 24/58 439/620.21 |

(Continued)

*Primary Examiner* — Christopher P McAndrew
*Assistant Examiner* — Zannatul Ferdous
(74) *Attorney, Agent, or Firm* — Ladas & Parry, LLP

(57) ABSTRACT

An installation structure of a temperature fuse is disclosed. The temperature fuse includes a first leg fixed to one surface of a printed circuit board (PCB), a bent part formed to be bent several times in an outer direction of the PCB from an end part of the first leg, and a second leg incorporated with the bent part and fixed to one surface of the PCB while being spaced apart from the first leg by a predetermined distance. The installation structure of the temperature fuse includes a third leg formed to extend from any one of the first leg and the second leg, a conductive member electrically connected to the third leg while being electrically isolated from the PCB, and a sensing part electrically connected to the third leg through the conductive member, and configured to detect whether a connection state between the third leg and the conductive member is normal.

8 Claims, 3 Drawing Sheets

(56) References Cited

U.S. PATENT DOCUMENTS

| | | | | |
|---|---|---|---|---|
| 2015/0015281 A1* | 1/2015 | Bogner | ............... | G01R 27/20 324/705 |
| 2016/0379791 A1* | 12/2016 | Lee | ............... | H01H 85/08 337/208 |
| 2018/0138966 A1* | 5/2018 | Ishiko | ............... | H04B 7/15507 |

* cited by examiner

[FIG1]
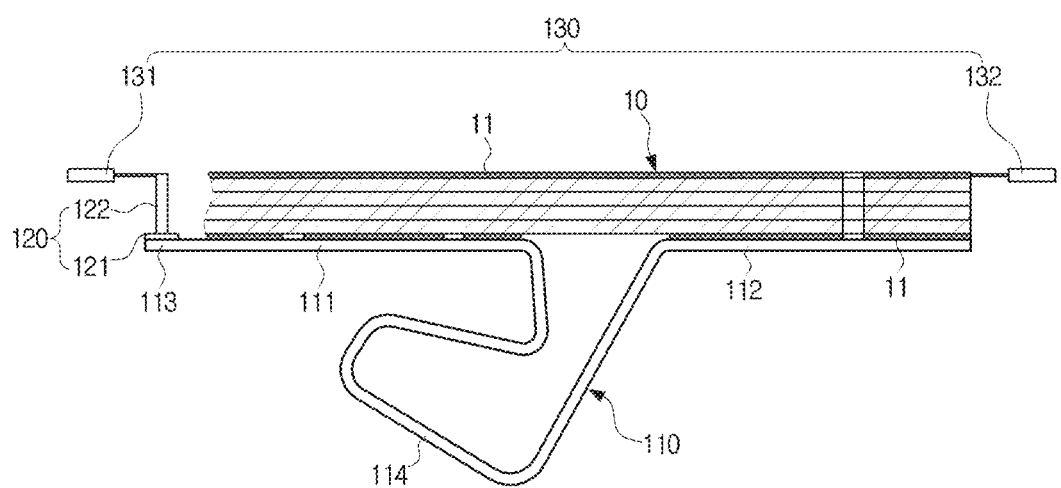

[FIG2]
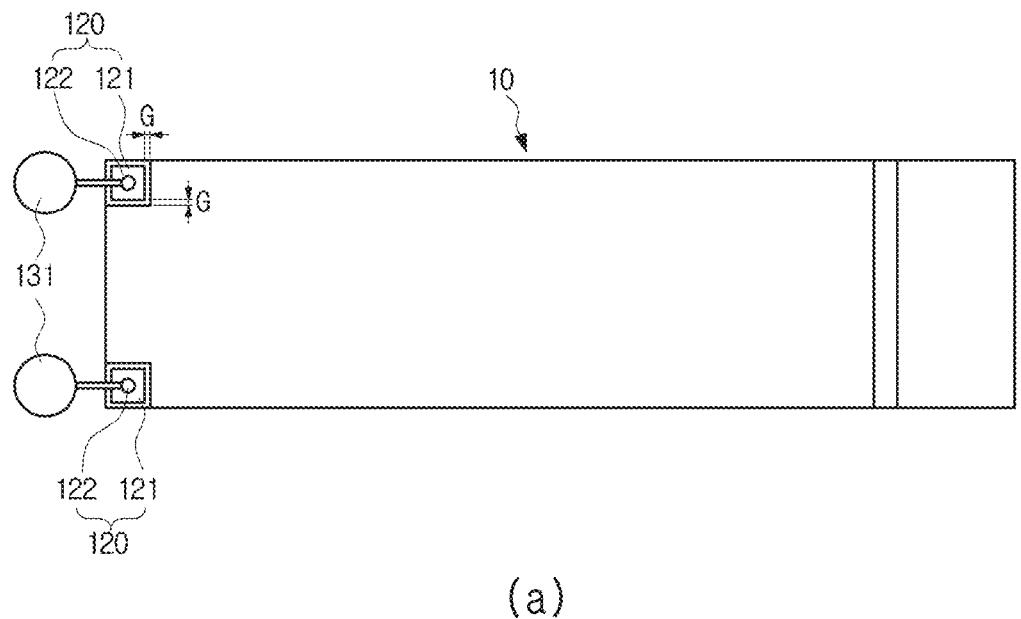
(a)
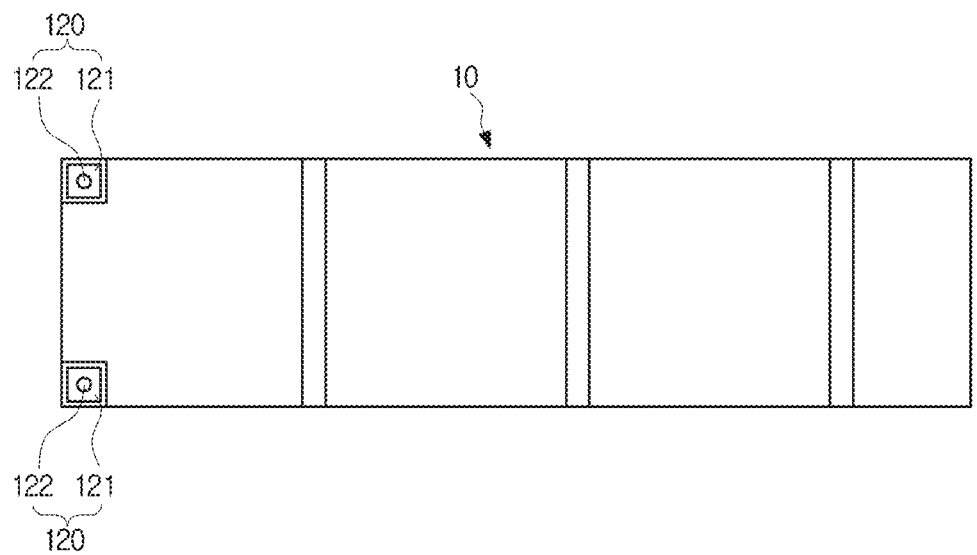
(b)

[FIG3]
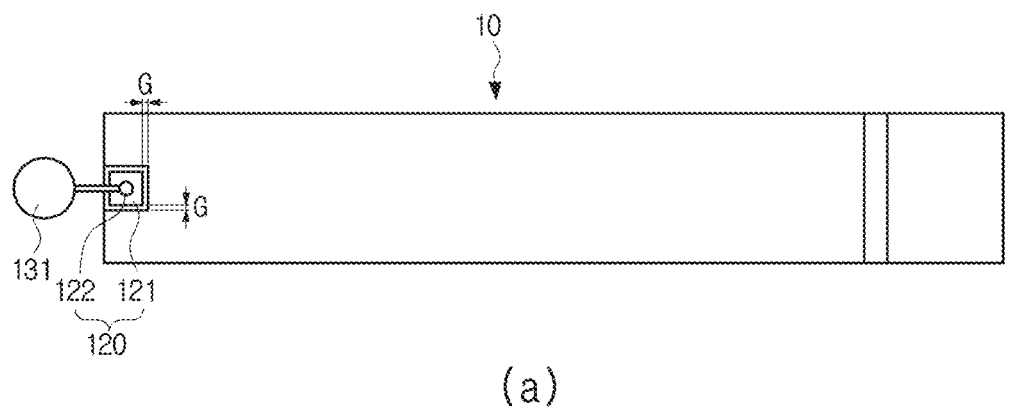
(a)
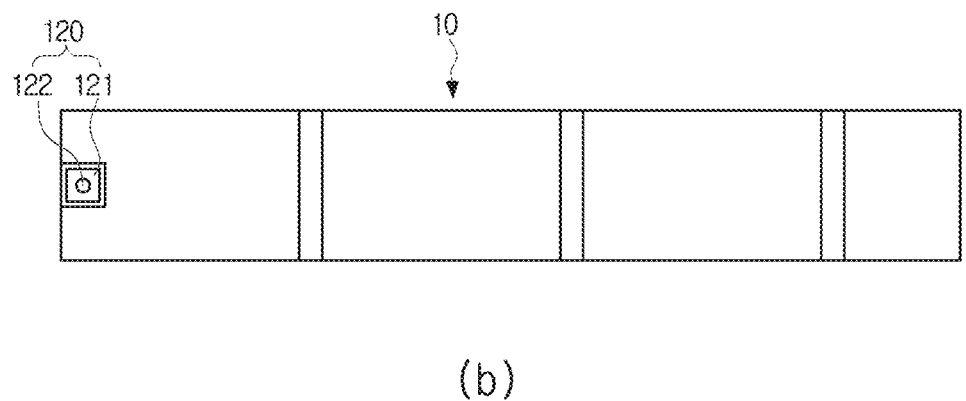
(b)

INSTALLATION STRUCTURE OF THERMAL FUSE

CROSS-REFERENCE TO RELATED APPLICATION

This application is based on and claims priority under 35 U.S.C. § 119 to Korean Patent Application No. 10-2017-0181933, filed on Dec. 28, 2017 in the Korean Intellectual Property Office, the disclosure of which is incorporated by reference in its entirety.

BACKGROUND

1. Field

Embodiments of the present disclosure relate to an installation structure of a temperature fuse, and more particularly to an installation structure of a temperature fuse to protect constituent circuits of an electric device from high temperature or overcurrent.

2. Description of the Related Art

Generally, a vehicle has been manufactured using Surface Mount Technology (SMT) in which Surface Mounted Components (SMC) capable of being directly mounted to a surface of a Printed Circuit Board (PCB) are mounted to electronic circuits such that the vehicle can use the electronic circuits provided with SMCs.

Electronic elements are generally called Surface Mount Devices (SMD). Surface Mount Technology (SMT) for use in electronic industrial fields has been used as a substitute for through-hole mounting technology in which pins of respective elements are inserted into PCB holes.

Meanwhile, in order to prevent accidents caused by overcurrent or overheating from occurring in electronic appliances, each electronic appliance includes a temperature fuse configured to turn off PCB circuits at a predetermined temperature or higher. For example, the temperature fuse has elastic force such that both legs of the temperature fuse are conductively soldered to a PCB such that the temperature fuse soldered to the PCB becomes electrically conductive. It is necessary for the temperature fuse to be electrically mounted to the PCB surface. For this purpose, both legs of the temperature fuse are generally fixed to the PCB surface through soldering. Therefore, provided that the PCB is in an abnormal state such that a soldered portion through which the temperature fuse mounted to the PCB is fixed is melted at a threshold temperature or higher, both legs of the temperature fuse are separated from the PCB such that circuits of the PCB are unavoidably turned off.

However, although a poor contact between the temperature fuse and the PCB occurs for a variety of reasons (for example, task errors, faulty fabrication, or evenness degradation) in the process of mounting the temperature fuse to the PCB, it is impossible for the conventional temperature fuse to detect such poor contact. As a result, the temperature fuse may abnormally operate, resulting in unexpected accidents caused by overheating of electronic appliances provided with such temperature fuses.

SUMMARY

Therefore, it is an aspect of the present disclosure to provide an installation structure of a temperature fuse to recognize a connection state of the temperature fuse mounted to a printed circuit board (PCB).

Additional aspects of the invention will be set forth in part in the description which follows and, in part, will be obvious from the description, or may be learned by practice of the invention.

In accordance with an aspect of the present disclosure, an installation structure of a temperature fuse is disclosed. The temperature fuse includes a first leg fixed to one surface of a printed circuit board (PCB), a bent part formed to be bent several times in an outer direction of the PCB from an end part of the first leg, and a second leg incorporated with the bent part and fixed to one surface of the PCB while being spaced apart from the first leg by a predetermined distance. The installation structure of the temperature fuse includes a third leg formed to extend from any one of the first leg and the second leg, a conductive member electrically connected to the third leg while being electrically isolated from the PCB, and a sensing part electrically connected to the third leg through the conductive member, and configured to detect whether a connection state between the third leg and the conductive member is normal.

The conductive member may include a first conductive part electrically connected to the third leg while simultaneously having an isolation section through which the first conductive part is electrically isolated from the printed circuit board (PCB), and a second conductive part configured to electrically connect the first conductive part to the sensing part.

The sensing part may include a first measurement part electrically connected to the conductive member, and a second measurement part electrically connected to either a first leg in which the third leg is not formed or a second leg, and configured to measure a resistance value.

BRIEF DESCRIPTION OF THE DRAWINGS

These and/or other aspects of the invention will become apparent and more readily appreciated from the following description of the embodiments, taken in conjunction with the accompanying drawings of which:

FIG. 1 is a cross-sectional view illustrating an installation structure of a temperature fuse according to an embodiment of the present disclosure.

FIG. 2 is a plan view illustrating an installation structure of a temperature fuse shown in FIG. 1 according to an embodiment of the present disclosure.

FIG. 3 is a plan view illustrating an installation structure of a temperature fuse according to another embodiment of the present disclosure.

DETAILED DESCRIPTION

Reference will now be made in detail to the embodiments of the present disclosure, examples of which are illustrated in the accompanying drawings. The embodiments to be described below are provided to fully convey the spirit of the present disclosure to a person skilled in the art. The present disclosure is not limited to the embodiments disclosed herein and may be implemented in other forms. In the drawings, some portions not related to the description will be omitted and will not be shown in order to clearly describe the present disclosure, and also the size of the component may be exaggerated or reduced for convenience and clarity of description.

FIG. 1 is a cross-sectional view illustrating an installation structure of a temperature fuse according to an embodiment of the present disclosure. FIG. 2 is a plan view illustrating the installation structure of the temperature fuse shown in FIG. 1.

Referring to FIGS. 1 and 2, the installation structure of the temperature fuse according to one aspect of the present disclosure may include a conductive member 120 electrically connected to a third leg 113 extending from any one of a first leg 111 and a second leg 112, and a sensing part 130 to detect a connection state between the third leg 113 and the temperature fuse through the conductive member 120.

The temperature fuse 110 may include a first leg 111, a bent part 114, a second leg 112, and a third leg 113. The first leg 111 may be fixed to one surface of the PCB 10. The bent part 114 may extend from one end of the first leg 111 toward an outer direction of the PCB 10. The second leg 112 may extend from the end of the bent part 114, and may be fixed to one surface of the PCB 10. The third leg 113 may extend from the first leg 111 or the second leg 112. For convenience of description and better understanding of the present disclosure, the temperature fuse 110 shown in the drawings is exemplarily mounted to a bottom surface of the PCB 10, without being limited thereto. However, the installation position at which the temperature fuse 110 is mounted to the PCB 10 is not limited thereto, and the temperature fuse 110 may also be mounted to a top surface of the PCB 10 without departing from the scope or spirit of the present disclosure.

Meanwhile, although the PCB 10 shown in the drawings is a multilayer PCB, the scope or spirit of the present disclosure is not limited thereto. A solder mask layer 11 may be formed at each of the highest layer and the lowest layer of the multilayer PCB 10.

The first leg 111 and the second leg 112 may be connected to the PCB 10 through soldering. Both the first leg 111 and the second leg 112 may be formed of the same soldering material. Alternatively, different soldering materials having different melting points may be applied to the first leg 111 and the second leg 112, such that the first leg 111 and the second leg 112 may be soldered to the PCB 10 using such different soldering materials. As a result, a soldering part of any one of the first leg 111 and the second leg 112 may be melted at a specific temperature, such that the temperature fuse 110 may start operation.

The first leg 111 and the second leg 112 may be spaced apart from each other by a predetermined distance, and may be soldered to the bottom surface of the PCB 10 while simultaneously adhering closely to the bottom surface of the PCB 10. The bent part 114 may be bent downward several times while simultaneously being disposed between the first leg 111 and the second leg 112, and may be incorporated with the first and second legs 111 and 112.

The temperature fuse 110 may be formed of a metal or nonmetal having elastic restoring force, without being limited thereto. When elements (not shown) are abnormal in condition and a temperature of the PCB 10 abruptly increases, the temperature fuse 10 mounted to the PCB 10 may stably prevent a current from being applied to the elements, such that the temperature fuse 10 can protect the elements from over current or overheating of the PCB 10. That is, any one of the first leg 111 and the second leg 112 is released from the PCB 10, such that the temperature fuse 110 may prevent a current from being applied to the elements of the PCB 10. In this case, the bent part 114 may be configured to store elastic force. Although the first leg 111 or the second leg 112 is separated from the PCB 10, such separation state of the first or second leg 111 or 112 can be maintained through the bent part 114.

In order to normally operate the temperature fuse 110, the above-mentioned installation structure of the temperature fuse 110 may determine whether the temperature fuse 110 is stably connected to the PCB 10, and may thus prevent accidents encountered by element overheating caused by malfunction of the temperature fuse 110 from occurring. Thus, in order to recognize whether a connection state of the temperature fuse is normal or abnormal, the first leg 111 or the second leg 112 may include the third leg 113. The third leg 113 may be formed to extend from the first leg 111 or the second leg 112.

Although the third leg 113 is formed to extend from the first leg 111 for convenience of description, the scope or spirit of the present disclosure is not limited thereto, and the third leg 113 may also be formed to extend from the second leg 112.

The third leg 113 may include the conductive member 120. The conductive member 120 is electrically connected to the third leg 113 while being electrically isolated from the PCB 10. In more detail, the conductive member 120 may include a first conductive part 121 electrically connected to the third leg 113, and a second conductive part 122 to electrically couple the first conductive part 121 and the sensing part 130. In more detail, the first conductive part 121 may be electrically connected to the third leg 113 while simultaneously having an isolation section G electrically isolated from the PCB 10.

If each of the first and second conductive parts 121 and 122 is formed of a conductive material, shapes of the first and second conductive parts 121 and 122 are not limited thereto, and the first and second conductive parts 121 and 122 may also be formed in other shapes without departing from the scope or spirit of the present disclosure. For example, the first conductive part 121 may be formed of metallic foil (for example, copper (Cu) foil, silver (Ag) foil, or aluminum (Al) foil) having one or more conductive layers. In addition, a peripheral region of the first conductive part 121 may be formed in an island shape having an isolation section G in a manner that only an upper part and a lower part of the first conductive part 121 are electrically connected to each other. In addition, the second conductive part 122 may be formed as a via through which the first conductive part 121 is electrically connected to the sensing part 130, or may also be formed as a separate line or the like.

The sensing part 130 may be electrically connected to the third leg 113 through the conductive member 120, thereby detecting a connection state between the temperature fuse and the third leg 113. In more detail, the sensing part 130 may include a first measurement part 131 electrically connected to the conductive member 120, and a second measurement part 132 electrically connected to either the first leg 111 in which the third leg 113 is not formed or the second leg 112.

The first measurement part 131 may be electrically connected to the second conductive part 122. Although not shown in the drawings, the first measurement part 131 may be mounted to the PCB 10 such that the first measurement part 131 can be implemented as an element capable of detecting a connection state between the conductive member 120 and the temperature fuse 110 together with the second measurement part 132.

The second measurement part 132 may be electrically connected to the second leg 112. The second measurement part 132 may determine a connection or non-connection state of the temperature fuse by measuring a resistance value through the temperature fuse 110. That is, when the temperature fuse 110 is well bonded to the PCB 10 and the temperature fuse 110 is electrically turned on through the conductive member 120, a resistance value measured by the first measurement part 131 of the sensing part 130 and another resistance value measured by the second measurement part 132 of the sensing part 130 have the same pattern. Thereafter, when the third leg 113 is slightly spaced apart from the first conductive part 12, the respective resistance values measured by the first and second measurement parts 131 and 132 are changed such that the sensing part 130 can detect a poor contact state of the temperature fuse 110. As a result, the second measurement part 132 may recognize a poor connection state between the temperature fuse 110 and the PCB 10 in advance, such that the temperature fuse 110 can be prevented from abnormally operating.

FIG. 2A is a plan view illustrating the highest layer of the PCB 10 composed of multilayer circuit boards, and FIG. 2B is a plan view illustrating the lowest layer of the PCB 10. Although two conductive members 120 and two sensing parts 130 are shown in the drawings for convenience of description, the scope or spirit of the present disclosure is not limited thereto. In another example, as shown in FIG. 3, only one conductive member 120 electrically connected to the third leg 113 and only one sensing part 130 electrically connected to the conductive member 120 may also be used as necessary.

As is apparent from the above description, the installation structure of the temperature fuse according to the embodiments of the present disclosure may recognize a connection state of the temperature fuse when poor contact between the temperature fuse and the PCB occurs for a variety of reasons (for example, task errors, faulty fabrication, or evenness degradation) in the process of mounting the temperature fuse to the PCB. As a result, the installation structure of the temperature fuse may prevent accidents caused by faulty fabrication or poor contact of the temperature fuse from occurring in advance.

Although a few embodiments of the present disclosure have been shown and described, it would be appreciated by those skilled in the art that changes may be made in these embodiments without departing from the principles and spirit of the invention, the scope of which is defined in the claims and their equivalents.

What is claimed is:

1. An installation structure of a temperature fuse which includes a first leg fixed to one surface of a printed circuit board (PCB), a bent part formed to be bent several times in an outer direction of the printed circuit board (PCB) from an end part of the first leg, and a second leg incorporated with the bent part and fixed to one surface of the printed circuit board (PCB) and spaced apart from the first leg by a predetermined distance, comprising:
   a third leg formed to extend from one of the first leg and the second leg;
   a conductive member electrically connected and fixed to the third leg and electrically isolated from the printed circuit board (PCB); and
   a sensing part electrically connected to the third leg through the conductive member, and configured to detect whether a connection state between the third leg and the conductive member is normal.

2. The installation structure of the temperature fuse according to claim 1, wherein the conductive member includes:
   a first conductive part electrically connected to the third leg and having an isolation section through which the first conductive part is electrically isolated from the printed circuit board (PCB); and
   a second conductive part configured to electrically connect the first conductive part to the sensing part.

3. The installation structure of the temperature fuse according to claim 1, wherein the sensing part includes:
   a first measurement part electrically connected to the conductive member; and
   a second measurement part electrically connected to either a first leg in which the third leg is not formed or a second leg, and configured to measure a resistance value.

4. An installation structure of a temperature fuse which includes a first leg fixed to one surface of a printed circuit board (PCB), a bent part formed to be bent several times in an outer direction of the printed circuit board (PCB) from an end part of the first leg, and a second leg incorporated with the bent part and fixed to one surface of the printed circuit board (PCB) while being spaced apart from the first leg by a predetermined distance, the installation structure of the temperature fuse comprising:
   a third leg formed to extend from one of the first leg and the second leg;
   a conductive member electrically connected to the third leg while being electrically isolated from the printed circuit board (PCB); and
   a sensing part electrically connected to the third leg through the conductive member, and configured to detect whether a connection state between the third leg and the conductive member is normal,
   wherein the conductive member includes:
   a first conductive part electrically connected to the third leg and having an isolation section through which the first conductive part is electrically isolated from the printed circuit board (PCB); and
   a second conductive part configured to electrically connect the first conductive part to the sensing part.

5. The installation structure of the temperature fuse according to claim 4, wherein the sensing part includes:
   a first measurement part electrically connected to the conductive member; and
   a second measurement part electrically connected to either a first leg in which the third leg is not formed or a second leg, and configured to measure a resistance value.

6. An installation structure of a temperature fuse comprising:
   a first leg fixed to one surface of a printed circuit board (PCB);
   a bent part formed to be bent several times in an outer direction of the printed circuit board (PCB) from an end part of the first leg;
   a second leg incorporated with the bent part and fixed to one surface of the printed circuit board (PCB) and spaced apart from the first leg by a predetermined distance;
   a third leg formed to extend from one of the first leg and the second leg;
   a conductive member electrically connected and fixed to the third leg and electrically isolated from the printed circuit board (PCB); and
   a sensing part electrically connected to the third leg through the conductive member, and configured to detect whether a connection state between the third leg and the conductive member is normal.

7. The installation structure of the temperature fuse according to claim 6, wherein the conductive member includes:

a first conductive part electrically connected to the third leg and having an isolation section through which the first conductive part is electrically isolated from the printed circuit board (PCB); and a second conductive part configured to electrically connect the first conductive part to the sensing part.

8. The installation structure of the temperature fuse according to claim 6, wherein the sensing part includes:

a first measurement part electrically connected to the conductive member; and a second measurement part electrically connected to either a first leg in which the third leg is not formed or a second leg, and configured to measure a resistance value.

* * * * *